(12) United States Patent
Yoon

(10) Patent No.: US 6,864,191 B2
(45) Date of Patent: Mar. 8, 2005

(54) HYDROGEN BARRIER LAYER AND METHOD FOR FABRICATING SEMICONDUCTOR DEVICE HAVING THE SAME

(75) Inventor: Dong-Soo Yoon, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 44 days.

(21) Appl. No.: 10/329,689

(22) Filed: Dec. 27, 2002

(65) Prior Publication Data

US 2003/0216056 A1 Nov. 20, 2003

(30) Foreign Application Priority Data

May 18, 2002 (KR) .............................. 10-2002-0027592

(51) Int. Cl.[7] .............................................. H01L 21/31
(52) U.S. Cl. ...................... 438/778; 438/158; 438/770; 438/773; 438/785
(58) Field of Search ................................. 438/770, 773, 438/778, 785, 158

(56) References Cited

U.S. PATENT DOCUMENTS

| 6,090,658 A | 7/2000 | Joo |
| 6,320,213 B1 * | 11/2001 | Kirlin et al. .................... 29/76 |
| 6,429,058 B1 * | 8/2002 | Colgan et al. ............... 438/158 |

FOREIGN PATENT DOCUMENTS

| KR | 2001-4362 | 1/2001 | ........... H01L/27/10 |
| WO | WO 02/23614 A1 | 3/2002 | ......... H01L/21/336 |

* cited by examiner

Primary Examiner—David Nelms
Assistant Examiner—Renee R. Berry
(74) Attorney, Agent, or Firm—Piper Rudnick LLP

(57) ABSTRACT

The present invention provides a hydrogen barrier layer able to prevent diffusions of hydrogen into a capacitor and a method for fabricating a semiconductor device having the same. The inventive method includes the steps of: depositing a zirconium-titanium oxide layer containing zirconium, titanium and oxygen on a substrate; and performing a reforming process for densifying the zirconium-titanium oxide layer and for stuffing oxygen in a surface of the zirconium-titanium oxide layer.

13 Claims, 3 Drawing Sheets

Figure 1:
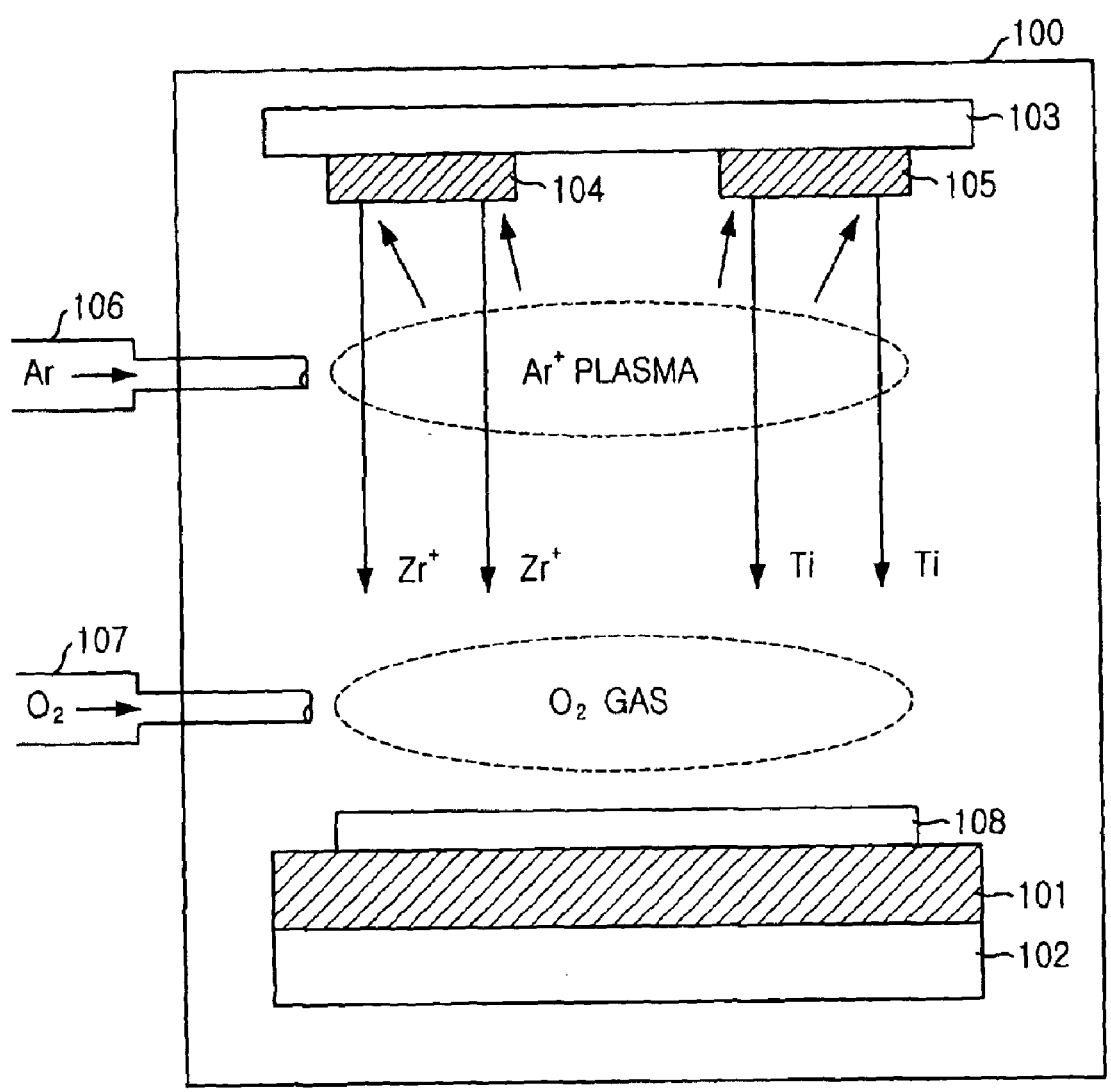

HYDROGEN BARRIER LAYER AND METHOD FOR FABRICATING SEMICONDUCTOR DEVICE HAVING THE SAME

FIELD OF THE INVENTION

The present invention relates to a method for fabricating a semiconductor device; and, more particularly, to a hydrogen barrier layer and a method for fabricating a semiconductor device having the same.

DESCRIPTION OF RELATED ARTS

In a semiconductive memory device such as a dynamic random access memory (DRAM) device and a ferroelectric random access memory (FeRAM) device, dielectric characteristics of a dielectric material of a capacitor are degraded during an integration process of a semiconductive memory device performed after a process for forming a capacitor.

The problem in that the dielectric layer of the capacitor in the semiconductive memory device is degraded will be described in more detail. In respect of fabricating a semiconductive memory device, an inter-layer dielectric layer (ILD) formation process, an inter-metal line dielectric layer (IMD) formation process and a passivation layer formation process are subsequently proceeded after forming the capacitor.

However, impurities, particularly, hydrogen that can degrade the dielectric layer of the capacitor can be induced while proceeding the above processes. The induced hydrogen can be directly diffused into the dielectric layer of the capacitor during the proceeding of the above process or can be indirectly diffused into the dielectric layer of the capacitor by being absorbed within an inter-layer dielectric layer, an inter-metal line dielectric layer or a passivation layer. As a result of this direct or indirect diffusion of the induced hydrogen, dielectric characteristics of the dielectric layer in the capacitor are degraded.

For instance, after fabricating a capacitor in a FeRAM device, a process for forming an inter-layer dielectric layer formed with a silicon oxide layer by using $SiH_4$ gas and $O_2$ gas as a reaction gas is proceed, and then hydrogen is induced as a by-product after the $SiH_4$ gas and the $O_2$ gas react with each other. The induced hydrogen is directly diffused into the dielectric layer of the capacitor, resulting in degradation of the dielectric layer of the capacitor and also absorbed into the inter-layer dielectric layer, resulting gradual degradation of the dielectric layer of the capacitor. Therefore, there further results in a loss of dielectric characteristics of the dielectric layer of the capacitor.

The problem in degradation of the dielectric layer of the capacitor due to the impurities such as hydrogen during the integration process of the semiconductive memory device occurs not only during the ILD process for forming an inter-layer dielectric layer, but also during the IMD process for forming an inter-metal line dielectric layer containing a high quantity of hydrogen and the passivation formation process.

As described the above, a source gas including hydrogen and plasma are used in the ILD process proceeded after forming the capacitor in accordance with a prior art. Hence, hydrogen atoms, ions and molecules are easily produced and diffused into a dielectric material, thereby inducing a hydrogen shock that causes dielectric characteristics of the dielectric layer to be degraded.

To solve the above problem, a dielectric layer formed with $Zr_2O_3$ or $TiO_2$ is recently used as a hydrogen diffusion barrier layer. However, this dielectric layer is not able to completely block the hydrogen diffusion.

SUMMARY OF THE INVENTION

It is, therefore, an object of the present invention to provide a hydrogen barrier layer capable of preventing hydrogen from being diffused into a capacitor and a method for fabricating a semiconductor device having the same so as to prevent dielectric characteristics of the capacitor from being degraded.

In accordance with an aspect of the present invention, there is provided a method for forming a zirconium-titanium oxide, comprising the steps of: depositing a zirconium-titanium oxide layer containing zirconium, titanium and oxygen on a substrate; and performing a reforming process for densifying the zirconium-titanium oxide layer and for stuffing oxygen in a surface of the zirconium-titanium oxide layer.

In accordance with another aspect of the present invention, there is also provided a method for fabricating a semiconductor device, comprising the step of: forming a capacitor on a substrate; depositing a zirconium-titanium oxide layer containing zirconium, titanium and oxygen on a substrate, wherein the capacitor is covered with the a zirconium-titanium oxide layer; and performing a reforming process for densifying the zirconium-titanium oxide layer and for stuffing oxygen in a surface of the zirconium-titanium oxide layer.

Particularly, the step of depositing the zirconium-titanium oxide layer includes the steps of: mounting a zirconium target and a titanium target inside of a reactive deposition chamber in which the substrate is loaded; supplying Ar gas and $O_2$ gas to the reactive deposition chamber; forming Ar plasma by ionizing the Ar gas; getting Ar ions contained in the Ar plasma collide to the zirconium target and the titanium target; and getting the zirconium and the titanium ions that come off from each of the zirconium and the titanium targets due to the collisions react with the $O_2$ gas.

BRIEF DESCRIPTION OF THE DRAWING(S)

Figure 2:
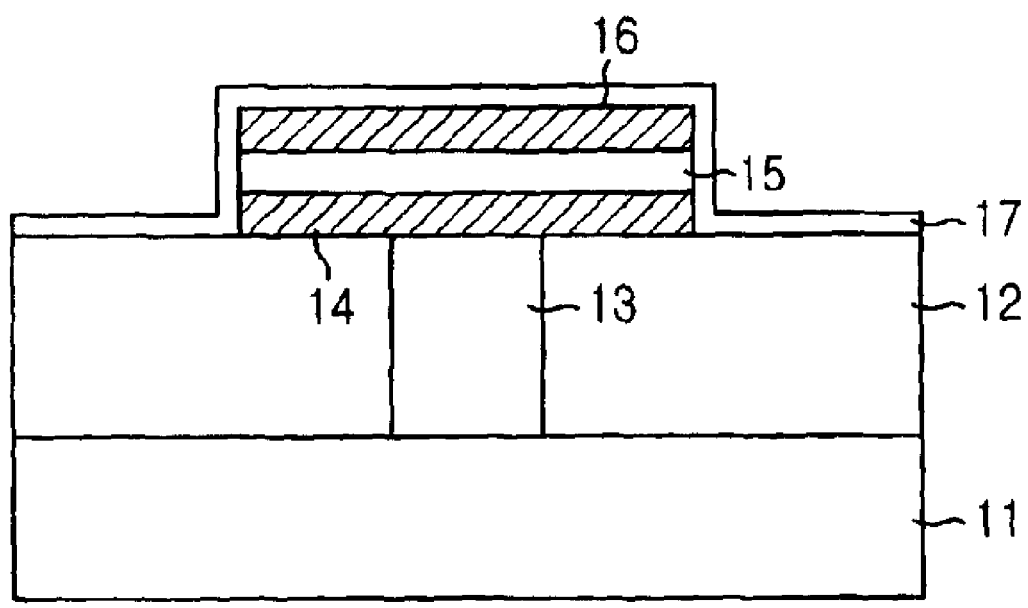
Figure 3:
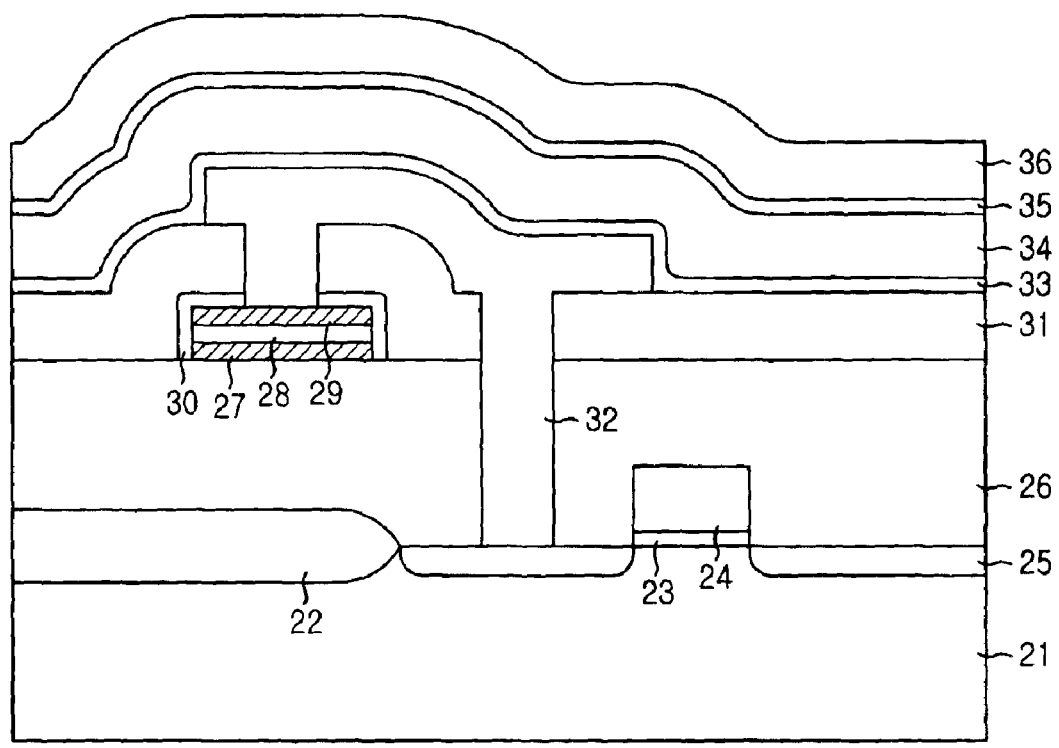

The above and other objects and features of the present invention will become apparent from the following description of the preferred embodiments given in conjunction with the accompanying drawings, in which:

FIG. 1 is a diagram illustrating a chamber for a physical vapor deposition in accordance with a preferred embodiment of the present invention;

FIG. 2 is a cross-sectional view illustrating a semiconductor device providing a hydrogen barrier layer formed with ZrTiO (zirconium-titanium oxide) in accordance with a preferred embodiment of the present invention; and FIG. 3 is a cross-sectional view illustrating a ferroelectric memory (FeRAM) device providing a hydrogen barrier layer formed with a zirconium-titanium oxide in accordance with another preferred embodiment of the present invention.

DETAILED DESCRIPTION OF THE INVENTION

The present invention employs ZrTiO (hereinafter referred as to zirconium-titanium oxide) of which density is theoretically higher than $Al_2O_3$ and $TiO_2$ typically used as a hydrogen barrier layer in a prior art. The zirconium-titanium oxide is a complex oxide material provided by mixing a zirconium oxide and a titanium oxide. The zirconium-titanium oxide has a complex reticulation structure established through a very strong chemical bonding due to the zirconium oxide contained within the zirconium-titanium oxide.

Since the complex oxide material including the zirconium oxide such as the zirconium-titanium oxide has a high density and a complex reticulation structure, it is possible to effectively prevent hydrogen diffusions.

The following preferred embodiment of the present invention will explain a physical vapor deposition (PVD) technique as a method for fabricating the complex oxide material containing the zirconium oxide.

FIG. 1 is a diagram illustrating a PVD chamber for depositing a zirconium-titanium oxide in accordance with a preferred embodiment of the present invention.

Referring to FIG. 1, the PVD chamber is a reactive deposition chamber 100 including a substrate supporting unit 102 for supporting a wafer 101, the wafer 101 on which a zirconium-titanium oxide is deposited, a target supporting unit 103 for supporting a zirconium target 104 and a titanium target 105, both being allocated to face in opposite direction of the wafer 101, an Ar gas supplier 106 for supplying Ar gas which is a sputter gas and an $O_2$ gas supplier 107 for supplying $O_2$ gas which is a reaction gas.

Herein, the Ar gas supplier 106 supplies inert gas such as Ar, while the $O_2$ gas supplier 107 supplies $O_2$ gas. An amount and time for supplying the Ar gas and the $O_2$ gas are controlled through a valve.

Also, the wafer 101 is mounted on the substrate supporting unit 102 so that a surface of the wafer 101 maintains a consistent parallel distance with the zirconium target 104 and the titanium target 105.

A process for depositing the zirconium-titanium oxide is proceeded firstly with a step of supplying a mixed gas of Ar gas and $O_2$ gas to a space between each of the zirconium target 104 and the titanium target 105 and the wafer 101 in a vacuum state with a high voltage. Then, the Ar gas is ionized to generate Ar plasma, and $Ar^+$ ions that constitute the Ar plasma are accelerated by an electric field and collided to each surface of the zirconium target 104 and the titanium target 105.

Due to transformational energy from the collision, atoms or molecules that present at the surface of each zirconium target 104 and the titanium target 105 are come off, and these atoms or molecules $Zr^+$ and $Ti^+$ chemically react with the reaction gas, that is, the $O_2$ gas, so as to deposit a zirconium-titanium oxide (108) on the wafer 101.

FIG. 2 is a cross-sectional view illustrating a ferroelectric random access memory (FeRAM) device including a zirconium-titanium oxide as a hydrogen barrier layer in accordance with the preferred embodiment of the present invention.

With reference to FIG. 2, an inter-layer dielectric layer 12 is deposited on a substrate 11 completed with a transistor formation process. Thereafter, a storage node contact 13 that contacts to the substrate 11 by passing through the inter-layer dielectric layer 12 is formed, and a capacitor including a lower electrode 14, a dielectric layer 15 and an upper electrode 16 is subsequently formed. Herein, the capacitor is connected to the storage node contact 13.

Continuously, the substrate 11 with the capacitor is loaded inside of the reactive deposition chamber, and Ar gas and $O_2$ gas are inputted to the reactive deposition chamber as to generate Ar plasma, which is, in turn, ionized. Then, $Ar^+$ ions are collided to the zirconium and the titanium targets 104 and 105 by an electric filed. Zirconium and titanium ions that discharged from each target due to the collisions react with the $O_2$ gas so that a zirconium-titanium oxide 17 is deposited on an entire surface of the substrate 11.

The deposition of the zirconium-titanium oxide 17 is carried out at a temperature ranging from about 100° C. to about 900° C., and a thickness of the deposited zirconium-titanium oxide 17 ranges from about 200 Å to about 1000 Å. Each of zirconium (Zr), titanium (Ti) and oxygen (O) contained within the zirconium-titanium oxide 17 has a compositional ratio maintained within a range from about 50 at % to about 90 at %, from about 10 at % to about 50 at % and from about 1 at % to about 80 at %, respectively.

Next, the deposited zirconium-titanium oxide 17 is densified, and a subsequent reforming process for stuffing oxygen to a surface of the zirconium-titanium oxide 17 is proceeded thereafter.

The above densification and oxygen stuffing processes are performed inside of the reactive deposition chamber or an additional thermal process chamber.

With respect to the thermal process chamber, the deposited zirconium-titanium oxide 17 is transferred to the thermal process chamber to perform a rapid thermal process (RTP). Herein, the RTP is performed in an atmosphere of $O_2$ or a mixture of either Ar and $O_2$ or $N_2$ and $O_2$. Also, the RTP is carried out at a temperature in a range from about 100° C. to about 650° C. for about one minute to about five minutes. At this time, the RTP is proceeded by changing each flow quantity of $O_2$, Ar and $N_2$.

Next, the following will describe the densification of the zirconium-titanium oxide 17 and the oxygen stuffing process performed inside of the reactive deposition chamber.

As a first example, $O_2$ is inputted to the reactive deposition chamber and ionized during the deposition of the zirconium-titanium oxide 17. Then, an electric filed provided from a substrate side accelerates the ionized oxygen toward a side where the zirconium-titanium oxide 17 is deposited so as to densify the zirconium-titanium oxide 17 as simultaneously as to stuff oxygen to the zirconium-titanium oxide 17.

As a second example, Ar is inputted inside of the reactive deposition chamber and ionized so that the Ar ions are collided to the zirconium-titanium oxide 17. The collisions cause the deposited zirconium-titanium oxide 17 to be densified. Then, the oxygen ions are additionally inputted to form a uniform oxide layer on the zirconium-titanium oxide 17.

As a third example, $N_2$ is inputted inside of the reactive deposition chamber and ionized so that the $N_2$ ions are collided to the zirconium-titanium oxide 17. The collisions cause the deposited zirconium-titanium oxide 17 to be densified. Then, the oxygen ions are additionally inputted so as to form a uniform oxide layer on the zirconium-titanium oxide 17.

As a forth example, $N_2$ and $O_2$ are simultaneously inputted to the reactive deposition chamber and ionized so that the ionized $N_2$ ions are collided to the zirconium-titanium oxide 17, thereby densifying the deposited zirconium-titanium oxide 17. After the densification, the ionized oxygen is used to form a uniform oxide layer on the zirconium-titanium oxide 17.

As a fifth example, $NH_4$ is thermally processed inside of the reactive deposition chamber so as to densify the zirconium-titanium oxide 17. Then, oxygen additionally inputted is ionized, and the ionized oxygen is used to form a uniform oxide layer on the zirconium-titanium oxide 17.

As a sixth example, $NH_4$ plasma or $NH_4$ plasma with oxygen plasma are simultaneously processed so that the zirconium-titanium oxide 17 is densified and a uniform oxide layer is formed on the zirconium-titanium oxide 17.

As a seventh example, UV ozone is employed for a thermal process inside of the reactive deposition chamber so as to densify the zirconium-titanium oxide 17 as simultaneously as to form a uniform oxide layer on the zirconium-titanium oxide.

By combining the above first to seventh examples, the zirconium-titanium oxide 17 is densified and stuffed with oxygen. Also, the above examples are carried out at a temperature ranging from about 100° C. to about 650° C. for about one minute to about five minutes.

FIG. 3 is a cross-sectional view showing a FeRAM device having a zirconium-titanium oxide as a hydrogen barrier layer in accordance with another preferred embodiment of the present invention.

Referring to FIG. 3, a field oxide layer 22 for isolating elements on a substrate 21 is formed. Then, a typical transistor including a gate oxide 23, a gate electrode 24 and a source/drain 25 is formed on the substrate 21.

After completing the transistor formation, a first inter-layer dielectric (hereinafter referred as to ILD-1) layer 26 is deposited on the substrate including the gate electrode 24 and planarized thereafter. Then, a capacitor is formed by stacking a lower electrode 27, a ferroelectric layer 28 and an upper electrode 29 on the ILD-1 layer 26, and a first zirconium-titanium oxide 30 is deposited on an entire surface of the capacitor. After the deposition, the first zirconium-titanium oxide 30 is etched in a form that encompasses the capacitor entirely.

Subsequently, a second inter-layer dielectric (hereinafter referred as to ILD-2) layer 31 is deposited on an entire surface including the first zirconium-titanium oxide 30. Then, the ILD-2 layer 31 and the first zirconium-titanium oxide 30 are selectively etched so as to form a contact hole for wiring that exposes a predetermined surface of the upper electrode 29 of the capacitor and the source/drain 25 of the transistor.

Herein, the first zirconium-titanium oxide 30 prevents hydrogen produced during the deposition of the ILD-2 layer 31 from being diffused into the capacitor.

Continuously, a first metal line 32 that connects the capacitor to the transistor through the contact hole is formed, and then, a second zirconium-titanium oxide 33 is deposited on an entire structure including the first metal line 32.

Subsequently, an inter-metal dielectric layer 34 is deposited on the second zirconium-titanium oxide 33, and a second metal line (not shown) is formed on the inter-metal dielectric layer 34. A third zirconium-titanium oxide 35 is deposited on the second metal line.

Thereafter, a passivation layer 36 is formed on the third zirconium-titanium oxide 35.

Herein, the second zirconium-titanium oxide 33 prevents hydrogen produced during the deposition of the inter-metal dielectric layer 34 from being diffused into the capacitor by passing through the ILD-2 layer 31. The third zirconium-titanium oxide 35 also prevents hydrogen produced during the deposition of the passivation layer from being diffused into the inter-metal dielectric layer 34.

The FeRAM device forms the zirconium-titanium oxide after forming the capacitor and the metal lines and before forming the passivation layer so to prevent diffusions of hydrogen produced from each process. The deposition and reforming processes with respect to the zirconium-titanium oxide are proceeded in accordance with the preferred embodiment of the present invention.

Also, since zirconium is added to the zirconium-titanium oxide, it is possible to obtain a reticulation structure due to a very strong chemical bonding of the zirconium.

In other words, the zirconium-titanium oxide formed in accordance with the present invention has a high density and a very complex reticulation structure, and thus, it effectively prevents diffusions of hydrogen produced during subsequent processes after the capacitor formation.

Although it is not illustrated in the drawing, a capacitor employing particularly a BST as a dielectric layer in a dynamic random access memory (DRAM) device can also use the zirconium-titanium oxide as a hydrogen barrier layer.

The present invention provides a benefit in that diffusions of hydrogen produced during subsequent processes performed after forming a capacitor are effectively prevented. This prevention further results in an improvement on a dielectric characteristic of the capacitor, thereby attaining reliability of a semiconductor device.

While the present invention has been described with respect to certain preferred embodiments, it will be apparent to those skilled in the art that various changes and modifications may be made without departing from the scope of the invention as defined in the following claims.

What is claimed is:

1. A method for forming a zirconium-titanium oxide, comprising the steps of:
   depositing a zirconium-titanium oxide layer containing zirconium, titanium and oxygen on a substrate; and
   performing a reforming process for densifying a surface of the zirconium-titanium oxide layer by stuffing oxygen on the surface of the zirconium-titanium oxide layer.

2. The method as recited in claim 1, wherein the step of depositing the zirconium-titanium oxide layer includes the steps of:
   mounting a zirconium target and a titanium target inside of a reactive deposition chamber in which the substrate is loaded;
   supplying Ar gas and $O_2$ gas to the reactive deposition chamber;
   forming Ar plasma by ionizing the Ar gas;
   getting Ar ions contained in the Ar plasma collide to the zirconium target and the titanium target; and
   getting the zirconium and the titanium ions that come off from each of the zirconium and the titanium targets due to the collisions react with the $O_2$ gas.

3. The method as recited in claim 1, wherein the step of depositing the zirconium-titanium oxide layer is carried out at a temperature ranging from about 100° C. to about 900° C.

4. The method as recited in claim 1, wherein the zirconium-titanium oxide has a compositional ratio of zirconium, titanium and oxygen ranging from about 50 at % to about 90 at %, from about 10 at % to about 50 at % and from about 1 at % to about 80 at %, respectively.

5. The method as recited in claim 1, wherein the reforming process is performed in a reactive deposition chamber in which the zirconium-titanium oxide layer is deposited or an additional thermal process chamber.

6. A method for fabricating a semiconductor, comprising the step of:

forming a capacitor on a substrate;

depositing a zirconium-titanium oxide layer containing zirconium, titanium and oxygen on a substrate, wherein the capacitor is covered with the a zirconium-titanium oxide layer; and performing a reforming process for densifying a surface of the zirconium-titanium oxide layer by stuffing oxygen on the surface of the zirconium-titanium oxide layer.

7. The method as recited in claim 6, wherein the step of depositing the zirconium-titanium oxide layer includes the steps of:

mounting a zirconium target and a titanium target inside of a reactive deposition chamber in which the substrate is loaded;

supplying Ar gas and $O_2$ gas to the reactive deposition chamber;

forming Ar plasma by ionizing the Ar gas;

getting Ar ions contained in the Ar plasma collide to the zirconium target and the titanium target; and getting the zirconium and the titanium ions that come off from each of the zirconium and the titanium targets due to the collisions react with the $O_2$ gas.

8. The method as recited in claim 6, wherein the step of depositing the zirconium-titanium oxide layer is carried out at a temperature ranging from about 100° C. to about 900° C.

9. The method as recited in claim 6, wherein the zirconium-titanium oxide has a compositional ratio of zirconium, titanium and oxygen ranging from about 50 at % to about 90 at %, from about 10 at % to about 50 at % and from about 1 at % to about 80 at %, respectively.

10. The method as recited in claim 6, wherein the reforming process is performed in a reactive deposition chamber in which the zirconium-titanium oxide layer is deposited or an additional thermal process chamber.

11. The method as recited in claim 6, further comprising the step of forming an inter layer insulating layer or an passivation layer before the step of depositing the the zirconium-titanium oxide layer.

12. The method as recited in claim 6, further comprising the step of forming an inter layer insulating layer or an passivation layer after the step of depositing the the zirconium-titanium oxide layer.

13. The method as recited in claim 6, wherein the zirconium-titanium oxide layer is deposited to a thickness ranging from about 200 Å to about 1000 Å.

* * * * *